US011771109B2

(12) United States Patent
Arensmeier

(10) Patent No.: US 11,771,109 B2
(45) Date of Patent: Oct. 3, 2023

(54) MONITORING FOR AND/OR DETECTING FREEZE-UP AND/OR PADDLE WEAR CONDITIONS WITHIN PRODUCT DISPENSERS AND MIXERS

(71) Applicant: EMERSON ELECTRIC CO., St. Louis, MO (US)

(72) Inventor: Jeffrey N. Arensmeier, Fenton, MO (US)

(73) Assignee: Copeland Comfort Control LP, St. Louis, MO (US)

(*) Notice: Subject to any disclaimer, the term of this patent is extended or adjusted under 35 U.S.C. 154(b) by 635 days.

(21) Appl. No.: 17/028,279

(22) Filed: Sep. 22, 2020

(65) Prior Publication Data

US 2021/0120842 A1 Apr. 29, 2021

Related U.S. Application Data

(60) Provisional application No. 62/925,520, filed on Oct. 24, 2019.

(51) Int. Cl.
| | |
|---|---|
| *A23G 9/22* | (2006.01) |
| *G08B 21/18* | (2006.01) |
| *G05B 19/042* | (2006.01) |
| *G01R 19/165* | (2006.01) |
| *A23G 9/28* | (2006.01) |
| *G01R 23/16* | (2006.01) |

(52) U.S. Cl.
CPC .............. *A23G 9/228* (2013.01); *A23G 9/28* (2013.01); *G01R 19/16571* (2013.01); *G01R 23/16* (2013.01); *G05B 19/0428* (2013.01); *G08B 21/182* (2013.01); *G05B 2219/2645* (2013.01)

(58) Field of Classification Search
CPC .... A23G 9/228; A23G 9/28; G01R 19/16571; G01R 23/16; G05B 19/0428; G05B 2219/2645; G08B 21/182
See application file for complete search history.

(56) References Cited

U.S. PATENT DOCUMENTS

| | | | |
|---|---|---|---|
| 1,449,458 A | 3/1923 | Sutermeister | |
| 3,612,459 A * | 10/1971 | Walls | F16B 45/06 248/340 |
| 4,638,640 A | 1/1987 | Whetstone et al. | |
| 5,158,506 A | 10/1992 | Kusano et al. | |
| 5,764,537 A * | 6/1998 | Walter | G01D 3/08 702/179 |

(Continued)

FOREIGN PATENT DOCUMENTS

| | | |
|---|---|---|
| CN | 104216446 | 12/2014 |
| CN | 104216446 A | 12/2014 |

OTHER PUBLICATIONS

W. Mack Grady (Harmonics and How They Relate to Power Factor (Year: 1993).*

(Continued)

*Primary Examiner* — Mohammad K Islam
(74) *Attorney, Agent, or Firm* — Harness, Dickey & Pierce, P.L.C.; Anthony G. Fussner

(57) ABSTRACT

Disclosed are exemplary embodiments for monitoring for and/or detecting freeze-up and/or paddle wear conditions within dispensers and mixers associated with soft frozen desserts (broadly, edibles or edible products) and crushed ice drinks (broadly, drinkables or potable products).

17 Claims, 9 Drawing Sheets

(56) References Cited

U.S. PATENT DOCUMENTS

| | | | |
|---|---|---|---|
| 6,370,892 B1 | 4/2002 | Ross | |
| 9,326,531 B1 | 5/2016 | Reich et al. | |
| 10,734,917 B2* | 8/2020 | Watanabe | H02M 3/156 |
| 2016/0041228 A1* | 2/2016 | Gerada | H02K 11/20 |
| | | | 310/156.01 |
| 2016/0365817 A1* | 12/2016 | Schuster | H02P 23/26 |

OTHER PUBLICATIONS

Alagi et al., A Practical Approach to Harmonic Compensation in Power Systems-Series Connection of Passive and Active Filters, 1991, IEEE (Year: 1991).*

Bhimte et al., Development of Smart Energy Meter in LabVIEW for Power Distribution Systems, IEEE, 2015 (Year: 2015).*

* cited by examiner

MONITORING FOR AND/OR DETECTING FREEZE-UP AND/OR PADDLE WEAR CONDITIONS WITHIN PRODUCT DISPENSERS AND MIXERS

CROSS-REFERENCE TO RELATED APPLICATION

This application claims the benefit of and priority to U.S. Provisional Application No. 62/925,520 filed Oct. 24, 2019. The entire disclosure of the above provisional application is incorporated herein by reference.

FIELD

The present disclosure relates to monitoring for and/or detecting freeze-up and/or paddle wear conditions within dispensers and mixers associated with soft frozen desserts (broadly, edibles or edible products) and crushed ice drinks (broadly, drinkables or potable products).

BACKGROUND

This section provides background information related to the present disclosure which is not necessarily prior art.

Horizontal cylinder dispensers are used to dispense soft frozen desserts, such as soft serve ice cream, frozen yogurt, other soft frozen edibles, etc. Horizontal cylinder dispensers are also used to dispense frozen, slushy, or crushed ice drinks, such as frozen coffee drinks, frozen margaritas, frozen daiquiris, other drinkables, etc.

One or more mixing, churning, agitating, stirring paddles, augers, beaters may be rotatably disposed within the cylinder of the product dispenser. The one or more mixing paddles may be rotated by a motor within the cylinder to dispense the product from the cylinder and out through an outlet or nozzle. The one or more mixing paddles may also be rotated by the motor to mix, churn, agitate the product ingredients in the cylinder, such as during relatively long inactive periods in which the product will not be dispensed.

DRAWINGS

The drawings described herein are for illustrative purposes only of selected embodiments and not all possible implementations, and are not intended to limit the scope of the present disclosure.

Corresponding reference numerals may indicate corresponding (though not necessarily identical) features throughout the several views of the drawings.

DETAILED DESCRIPTION

Example embodiments will now be described more fully with reference to the accompanying drawings.

As recognized herein, issues may occur with the motors that are used to drive the mixing paddles within the horizontal cylinders of soft frozen dessert and crushed ice drink dispensers and mixers. For example, a mixing paddle may be damaged from a high load caused by freezing of the edible or drinkable before dispensement. Excessive paddle wear and running the machine with too little mix within the horizontal cylinder may result in paddle damage, drive belt damage, expensive repairs, and extended downtime.

Disclosed herein are exemplary embodiments for monitoring for and/or detecting freeze-up and/or paddle wear conditions within dispensers and mixers associated with soft frozen desserts (broadly, edibles or edible products) and crushed ice drinks (broadly, drinkables or potable products). As disclosed herein, exemplary embodiments may be configured for monitoring paddle motor current or power and learning base line loads to determine if freeze-up is imminent or about to occur. If it is determined that freeze-up is imminent or about to occur, exemplary embodiments may also be configured for alerting or providing an alert (e.g., via audio alerts, visual indicators, e-mail, SMS, SM post, notification on a central facilities management panel, etc.) and/or shutting the machine down or reducing the refrigeration.

In an exemplary embodiment configured for monitoring for and/or detecting paddle wear conditions, electrical current or power of the paddle motor is monitored over time and compared against a moving average of peak electrical current of the paddle motor. In this example of monitoring for and/or detecting wear developed against a physics-based model of the expected behavior over time, a moving average of the electrical current peaks is compared to a moving or rolling average of the electrical current. When the peak based value exceeds the current based value by a specified amount, the wear condition is flagged. For example, the wear condition may be flagged when the peak based value exceeds the current based value raised to the 1.4 power.

Figure 1:
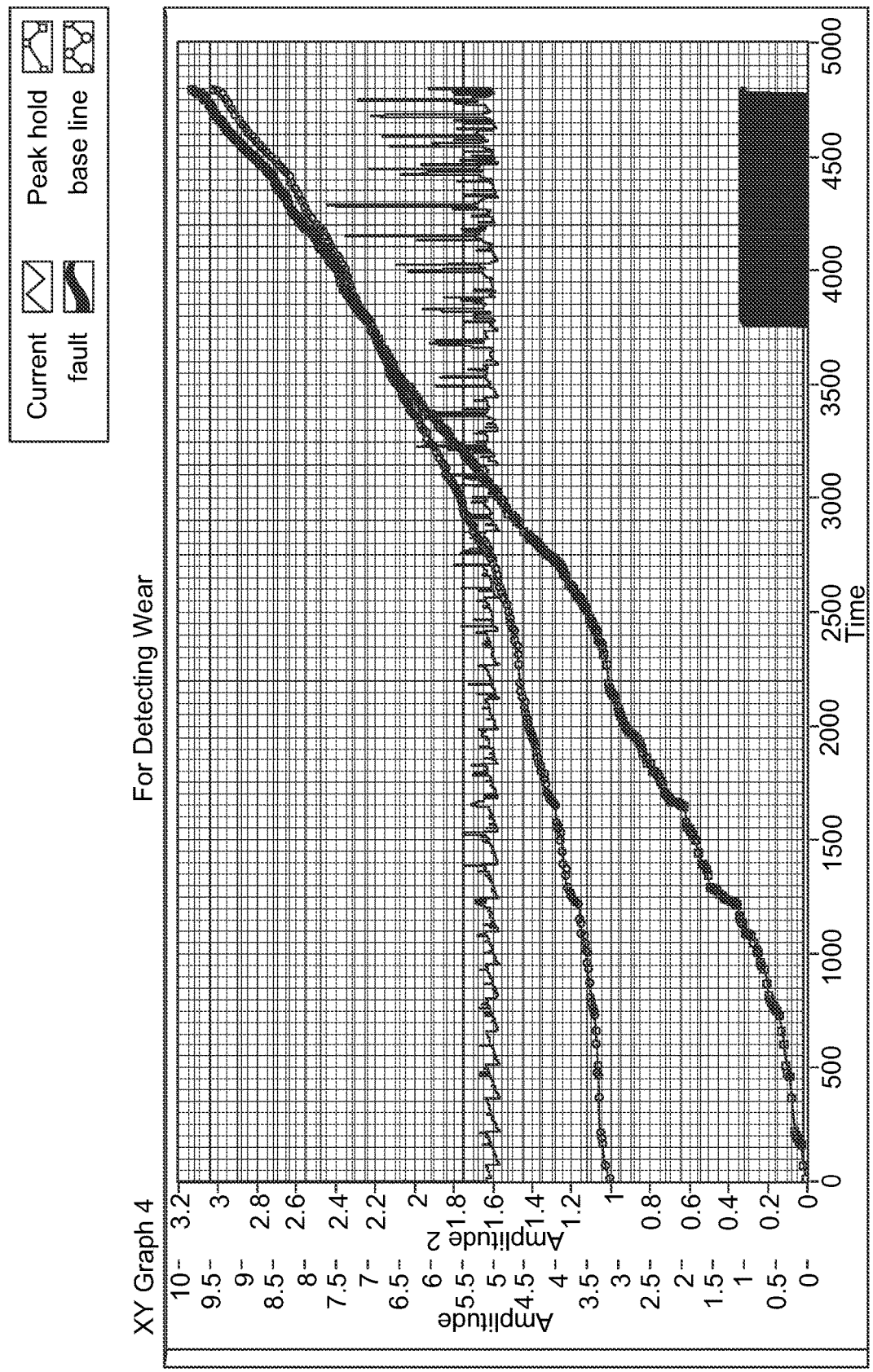
FIG. 1 is an exemplary line graph of amplitude versus time in seconds generated according to an exemplary embodiment configured for monitoring for and/or detecting paddle wear conditions.

FIG. 1 is an exemplary line graph of amplitude versus time in seconds generated according to an exemplary embodiment for monitoring for and/or detecting paddle wear conditions. As shown in FIG. 1, electrical current (identified as Current in FIG. 1) of a paddle motor is monitored over time and compared against a moving average of peak electrical current (identified as peak hold in FIG. 1) of the paddle motor. The moving average of the electrical current peaks (peak hold) is compared to a moving or rolling average of the electrical current (identified as base line in FIG. 1). When the peak based value (peak hold) exceeds the current based value (base line) by an amount, the wear condition is flagged. As shown in FIG. 1, a fault is indicated within the time range from about 3750 to about 4750 whereat the peak based value (peak hold) has exceeded the current based value (base line).

In an exemplary embodiment, data was acquired at 7860 hertz in blocks of 3840 samples although data may also be obtained differently, such as faster or slower (e.g., about one-half slower, etc.) An exemplary embodiment may use a power meter chip for determining real power, root mean square (RMS) voltage, and current, and sample the current for Fast Fourier Transform (FFT).

Exemplary embodiments configured for monitoring for and/or detecting freeze-up conditions include monitoring for a change in electrical current of the paddle motor due to product freeze. This generally occurs as a result of low product volume and/or poor paddle scraper maintenance.

Figure 2:
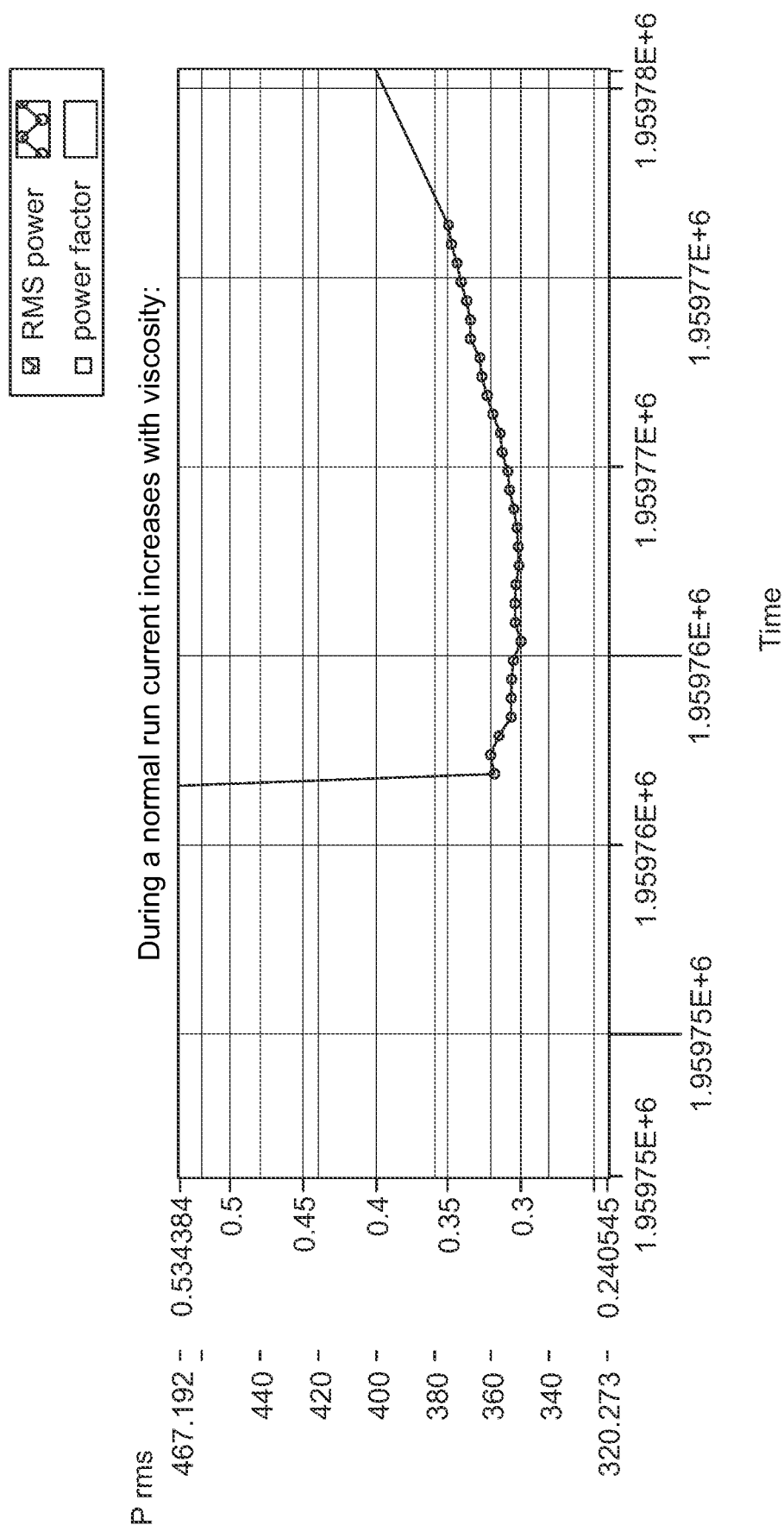
FIG. 2 is an exemplary line graph of amplitude versus time in seconds that generally shows electrical current increasing with viscosity during a normal operation.
Figure 3:
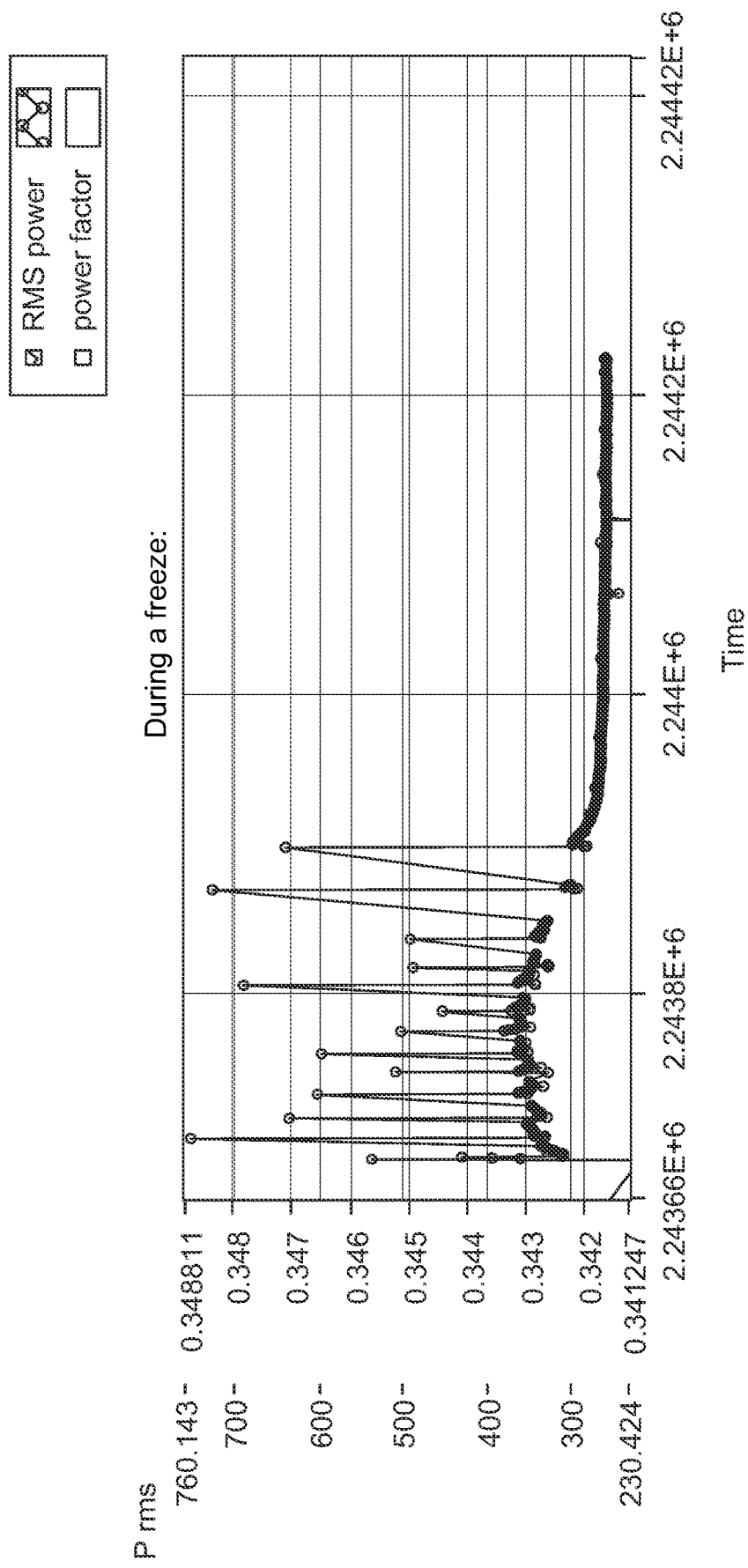
FIG. 3 is an exemplary line graph of amplitude versus time in seconds that generally shows electrical current decreasing during a freeze up.

During a normal run, it is known that electrical current increases with viscosity as shown by FIG. 2. During a freeze, it has been observed that electrical current initially decreases as shown in FIG. 3.

Figure 4:
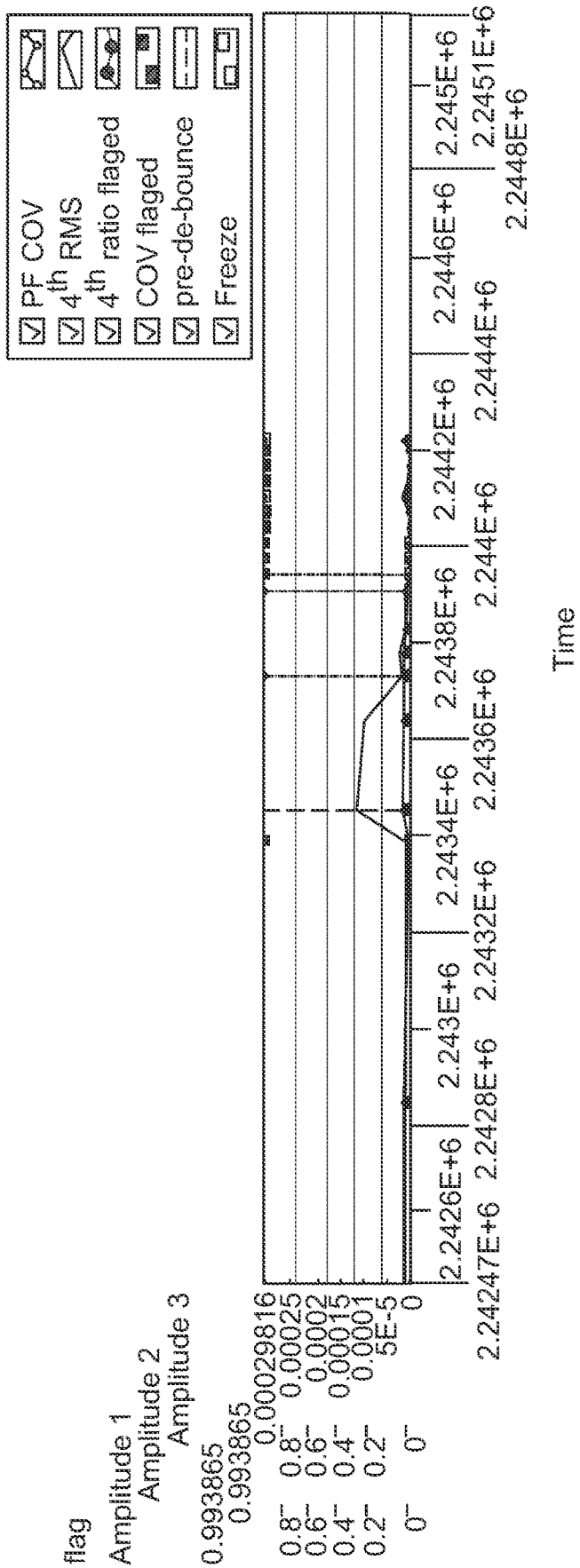
FIG. 4 is an exemplary line graph of amplitude versus time in seconds generated according to an exemplary embodiment configured for monitoring for and/or detecting freeze-up conditions.

The inventor hereof has recognized that the decrease in electrical current is not strictly unique to the freeze and independently diagnostic. Instead, the inventor further recognized that during a freeze up: the $4^{th}$ and $6^{th}$ harmonic of the motor current increases, the power factor oscillates, and the variance of the power factor decreases. Accordingly, an exemplary embodiment was configured to monitor, determine, or look for: (1) an increase in $4^{th}/1^{st}$ harmonic (normalizes for motor size); (2) a characteristic frequency in the power factor; and (3) reduction in the COV (coefficient of variation) of the power factor. See, for example, the exemplary line graph shown in FIG. 4 showing time locations along the X axis at which the COV flagged. In this example embodiment, the increase in $4^{th}/1^{st}$ harmonic may be monitored and/or determined by a ratio of the $4^{th}$ harmonic to fundamental. The characteristic frequency in the power factor may be monitored and/or determined by analysis of the FFT to find the predominate or primary frequency, which may generally include canned signal analysis function. The reduction in the COV of the power factor may be monitored and/or determined by monitoring and/or looking for a reduction in the variance of the power factor from the nominal. COV is used to normalize for the actual value, which may thereby allow deployment across various models without linking parameters to each model. Various motors, gear ratios, gear mechanisms and churn configurations will have different normal values.

Figure 5:
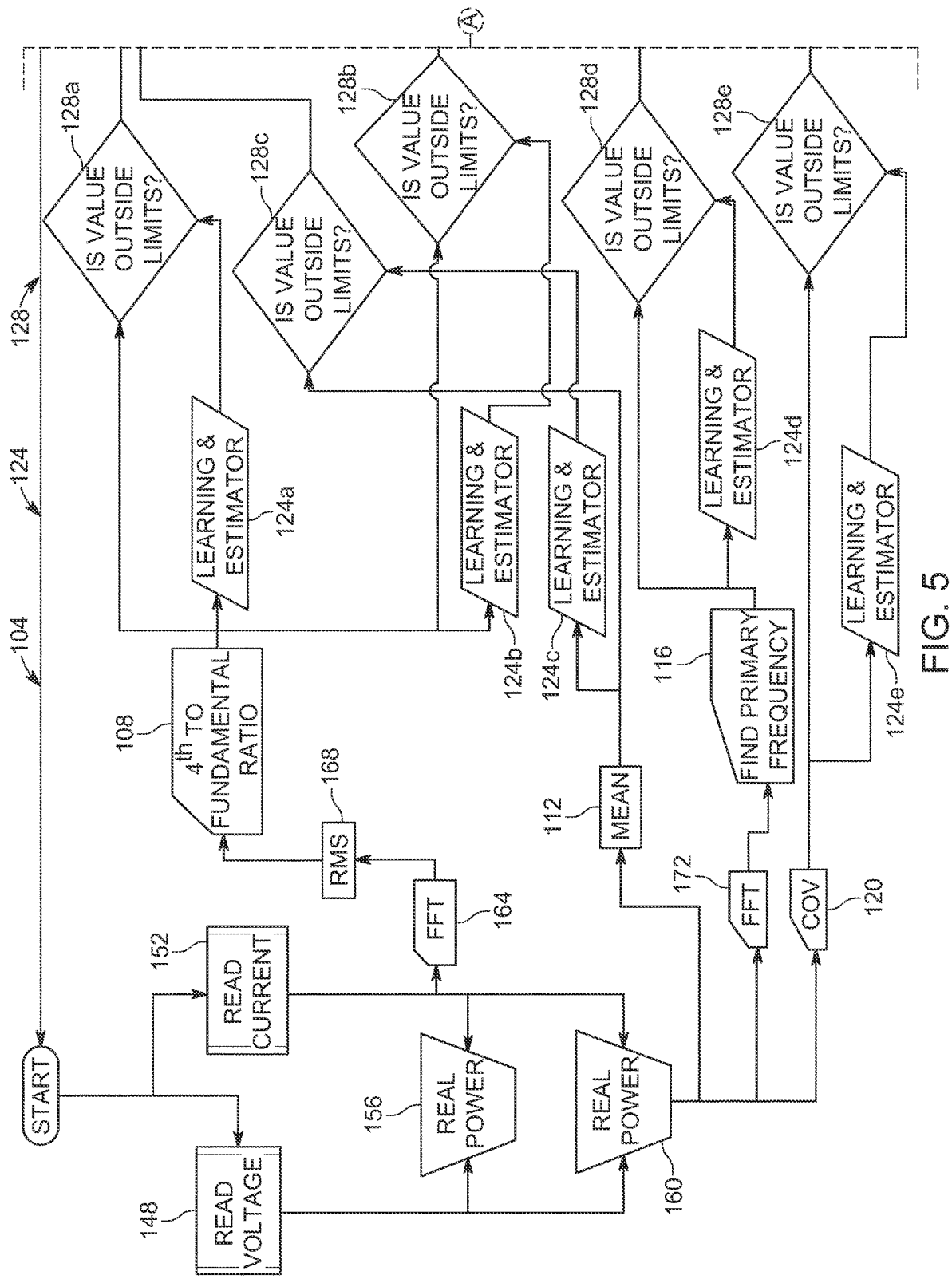
FIG. 5 is a flow chart illustrating an exemplary process for monitoring for and/or detecting paddle wear conditions using motor current and power according to an exemplary embodiment.
Figure 5:
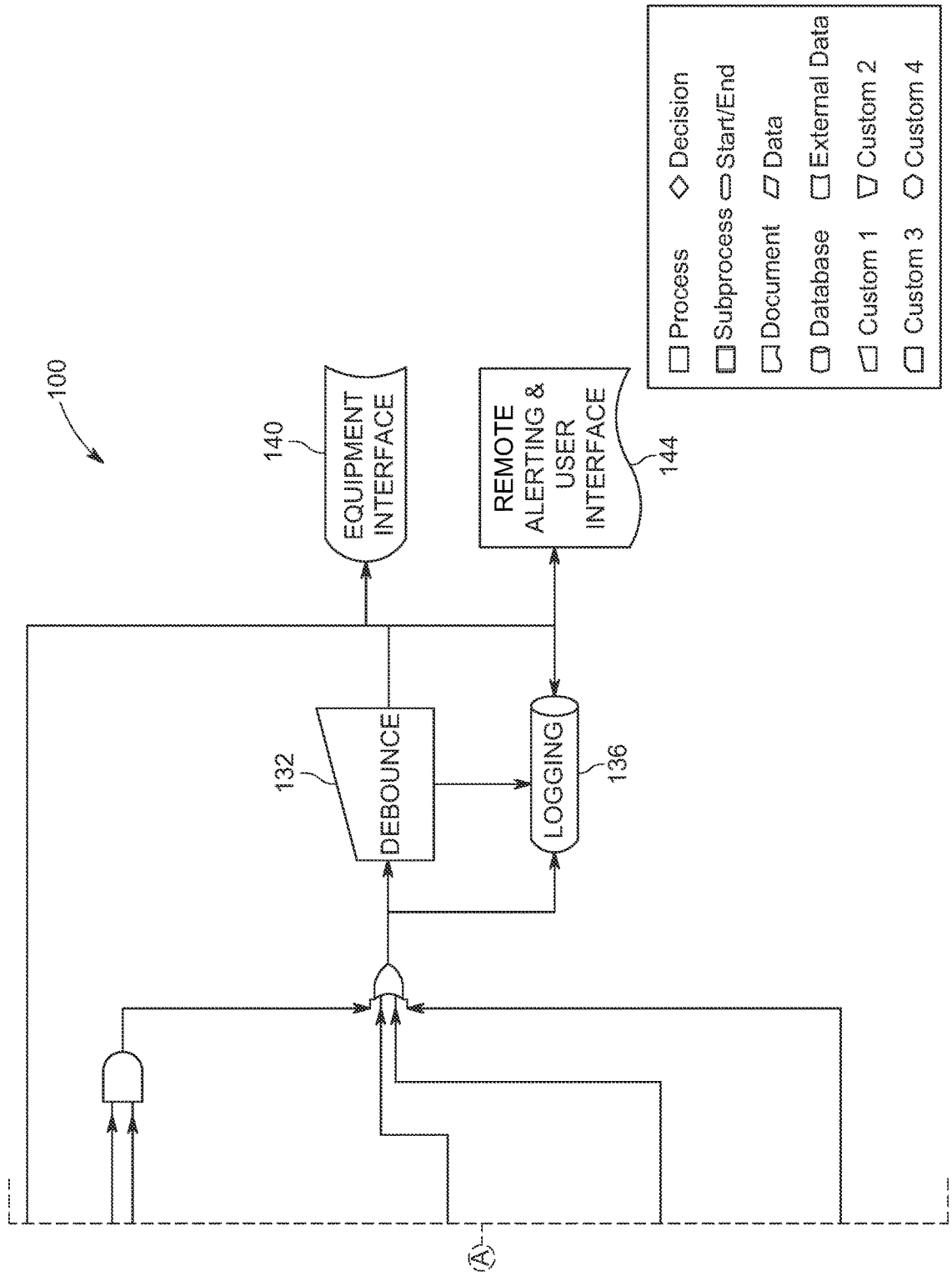

FIG. 5 is a flow chart illustrating an exemplary process 100 for monitoring for and/or detecting paddle wear conditions using motor current and power according to an exemplary embodiment. As shown in FIG. 5, the process 100 generally includes inputs 104 (e.g., $4^{th}$ harmonic to fundamental ratio 108, mean power factor 112, primary frequency 116, COV power factor 120), "learning & estimator" processes 124 (e.g., subroutines, etc.), and decisions 128. Also shown in FIG. 5 are debounce and logging processes 132 and 136, an equipment interface 140, and a remote alerting and user interface 144.

The inputs 104 are provided to and used by the "learning & estimator" processes 124 and the decisions 128 whereat it is determined whether or not the values are outside limits or thresholds. The limits or thresholds are learned, estimated, and/or actively determined by the "learning & estimator" processes 124 in this exemplary embodiment. In other exemplary embodiments, the limits or thresholds may be predetermined, equipment based, and/or fixed.

With continued reference to FIG. 5, the $4^{th}$ harmonic to fundamental ratio 108 is an input provided to the "learning & estimator" processes 124a, 124b and to the decisions 128a, 128b. The "learning & estimator" processes 124a, 124b uses the $4^{th}$ harmonic to fundamental ratio 108 to learn, estimate, and/or actively determine limit(s) or threshold(s) for the $4^{th}$ harmonic to fundamental ratio. At the decisions 128a, 128b, it is determined whether or not the $4^{th}$ harmonic to fundamental ratio 108 is outside the limit(s) or threshold(s) determined by the "learning & estimator" processes 124a, 124b, respectively. If the $4^{th}$ harmonic to fundamental ratio 108 is determined to be outside the limit(s) or threshold(s) at the decisions 128a and/or 128b, then an alert is generated. If the $4^{th}$ harmonic to fundamental ratio 108 is determined to be within the limit(s) or threshold(s) at the decisions 128a and 128b, then no alert is generated.

The mean power factor 112 is an input provided to the "learning & estimator" process 124c and to the decision 128c. The "learning & estimator" process 124c uses the mean power factor 112 to learn, estimate, and/or actively determine limit(s) or threshold(s) for the mean power factor. At the decision 128c, it is determined whether or not the mean power factor 112 is outside the limit(s) or threshold(s) determined by the "learning & estimator" process 124c. If the mean power factor 112 is determined to be outside the limit(s) or threshold(s) at the decision 128c, then an alert is generated. If the mean power factor 112 is determined to be within the limit(s) or threshold(s) at the decision 128c, then no alert is generated.

The primary frequency 116 is an input provided to the "learning & estimator" process 124d and to the decision 128d. The "learning & estimator" process 124d uses the primary frequency 116 to learn, estimate, and/or actively determine limit(s) or threshold(s) for the primary frequency. At the decision 128d, it is determined whether or not the primary frequency 116 is outside the limit(s) or threshold(s) determined by the "learning & estimator" process 124d. If the primary frequency 116 is determined to be outside the limit(s) or threshold(s) at the decision 128d, then an alert is generated. If the primary frequency 116 is determined to be within the limit(s) or threshold(s) at the decision 128d, then no alert is generated.

The COV power factor 120 is an input provided to the "learning & estimator" process 124e and to the decision 128e. The "learning & estimator" process 124e uses the COV power factor 120 to learn, estimate, and/or actively determine limit(s) or threshold(s) for the COV power factor. At the decision 128e, it is determined whether or not the COV power factor 120 is outside the limit(s) or threshold(s) determined by the "learning & estimator" process 124e. If the COV power factor 120 is determined to be outside the limit(s) or threshold(s) at the decision 128e, then an alert is generated. If the COV power factor 120 is determined to be within the limit(s) or threshold(s) at the decision 128e, then no alert is generated.

FIG. 5 also illustrates the exemplary manner in which the inputs 104 may be obtained. For example, the motor voltage reading 148 and motor current reading 152 may be used to determine or provide the real power 156 and power factor 160.

With the motor current reading 152, FFT (Fast Fourier Transform) 164 and RMS (root mean square) 168 may be used to determine or provide the $4^{th}$ harmonic to fundamental ratio 108 of the motor current. With the power factor 160, FFT 172 may be used to determine or provide the primary frequency.

Figure 6:
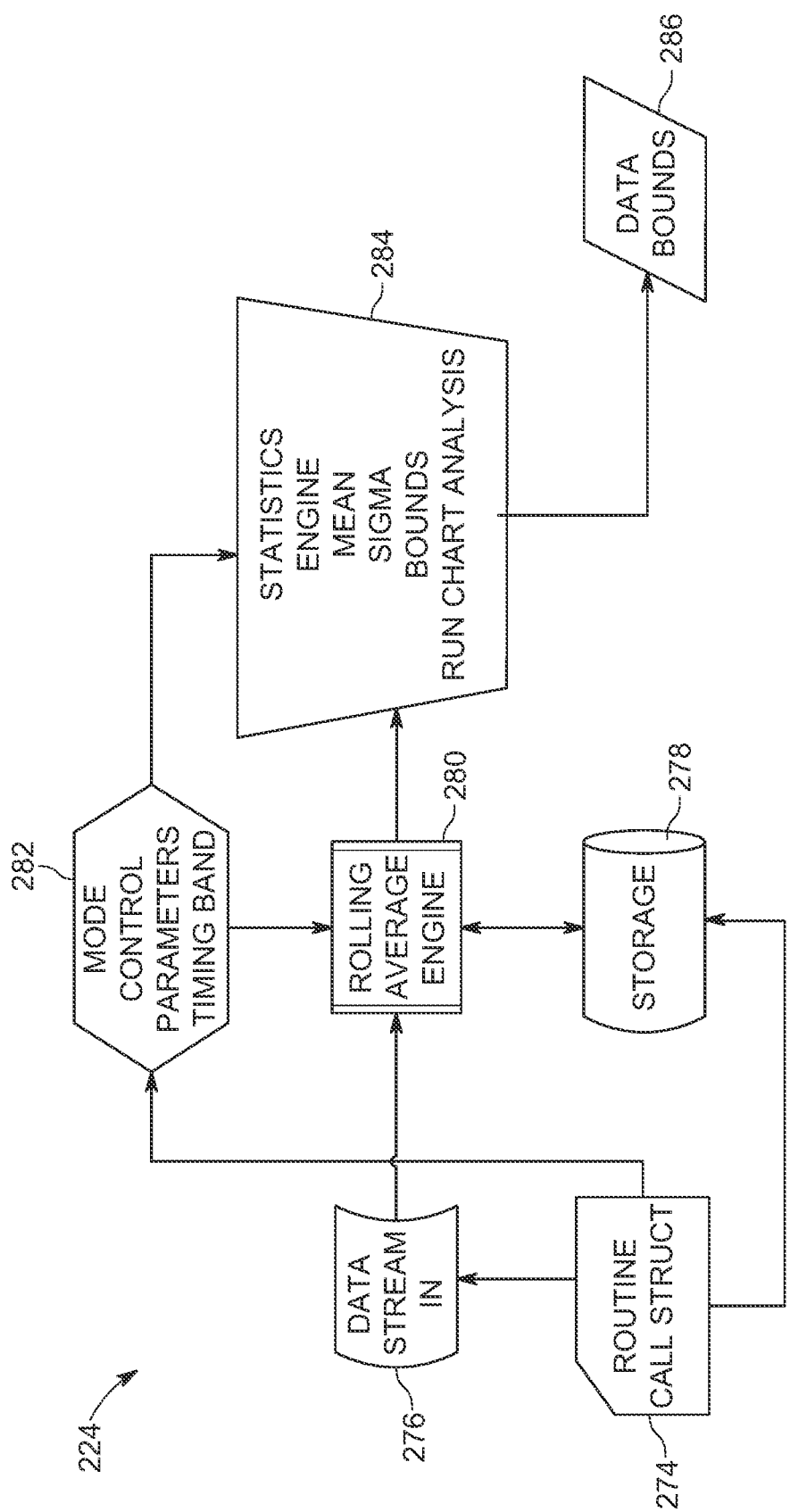
FIG. 6 is allow chart illustrating an exemplary learning and estimator process for providing limit(s) or threshold(s) according to an exemplary embodiment.

FIG. 6 is a flow chart illustrating an exemplary "learning and estimator" process 224 a subroutine, etc.) that may be used for the "learning and estimator" processes 124 shown in FIG. 5 according to an exemplary embodiment. Shown in FIG. 6 are a routine call structure 274, data stream in 276, storage 278, rolling average engine 280, mode control parameters 282 (timing band), statistics engine 284 (mean, sigma, bounds, run chart analysis), and data bounds 286.

Figure 7:
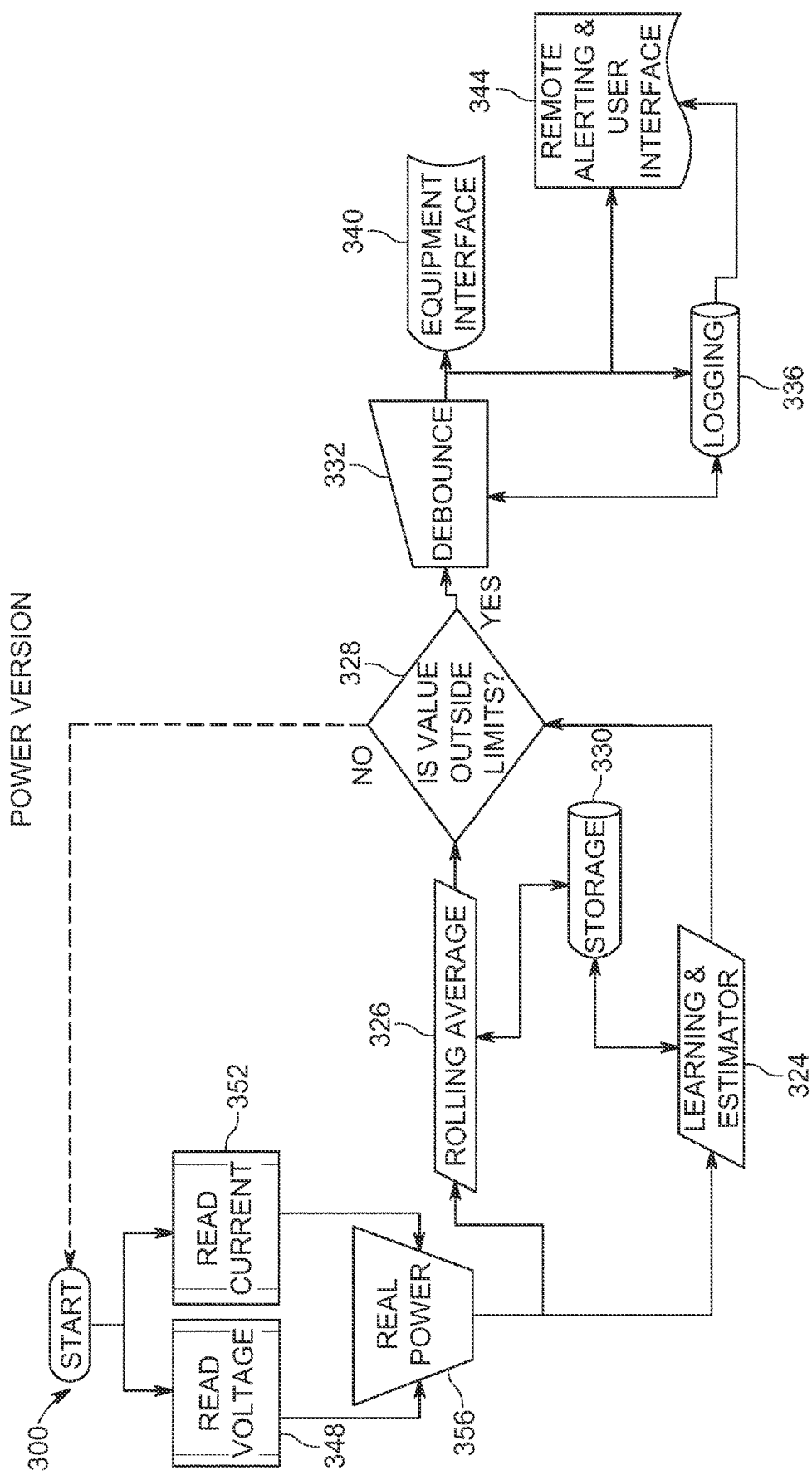
FIG. 7 is a flow chart illustrating an exemplary process for monitoring for and/or detecting paddle wear conditions using motor power according to an exemplary embodiment.

FIG. 7 is a flow chart illustrating an exemplary process 300 for monitoring for and/or detecting paddle wear conditions using motor power according to an exemplary embodiment. As shown in FIG. 7, the process 300 generally includes using the motor voltage reading 348 and motor current reading 352 to determine real power 356, which is an input provided to a "learning & estimator" process 324 and to a rolling average process 326. The outputs from the "learning & estimator" process 324 and rolling average process 326 may be stored within storage 330 and used at the decision 328, whereat it is determined whether or not the value(s) are outside limit(s) or threshold(s).

The "learning & estimator" process 324 uses the real power 356 to learn, estimate, and/or actively determine limit(s) or threshold(s) for the rolling average of the real power. At the decision 328, it is determined whether or not the rolling average of the real power is outside the limit(s) or threshold(s) determined by the "learning & estimator" process 324. If the rolling average of the real power is determined to be outside the limit(s) or threshold(s) at the decision 328, then an alert is generated. If the rolling average of the real power is determined to be within the limit(s) or threshold(s) at the decision 328, then no alert is generated.

Also shown in FIG. 7 are debounce and logging processes 332 and 336, an equipment interface 340, and a remote alerting and user interface 344. In this exemplary embodiment shown in FIG. 7, the limit(s) or threshold(s) regarding the real power rolling average is learned, estimated, and/or actively determined by the "learning & estimator" process 324, such as shown in FIG. 6, etc. In other exemplary embodiments, the limit(s) or threshold(s) may be predetermined, equipment based, and/or fixed.

Figure 8:
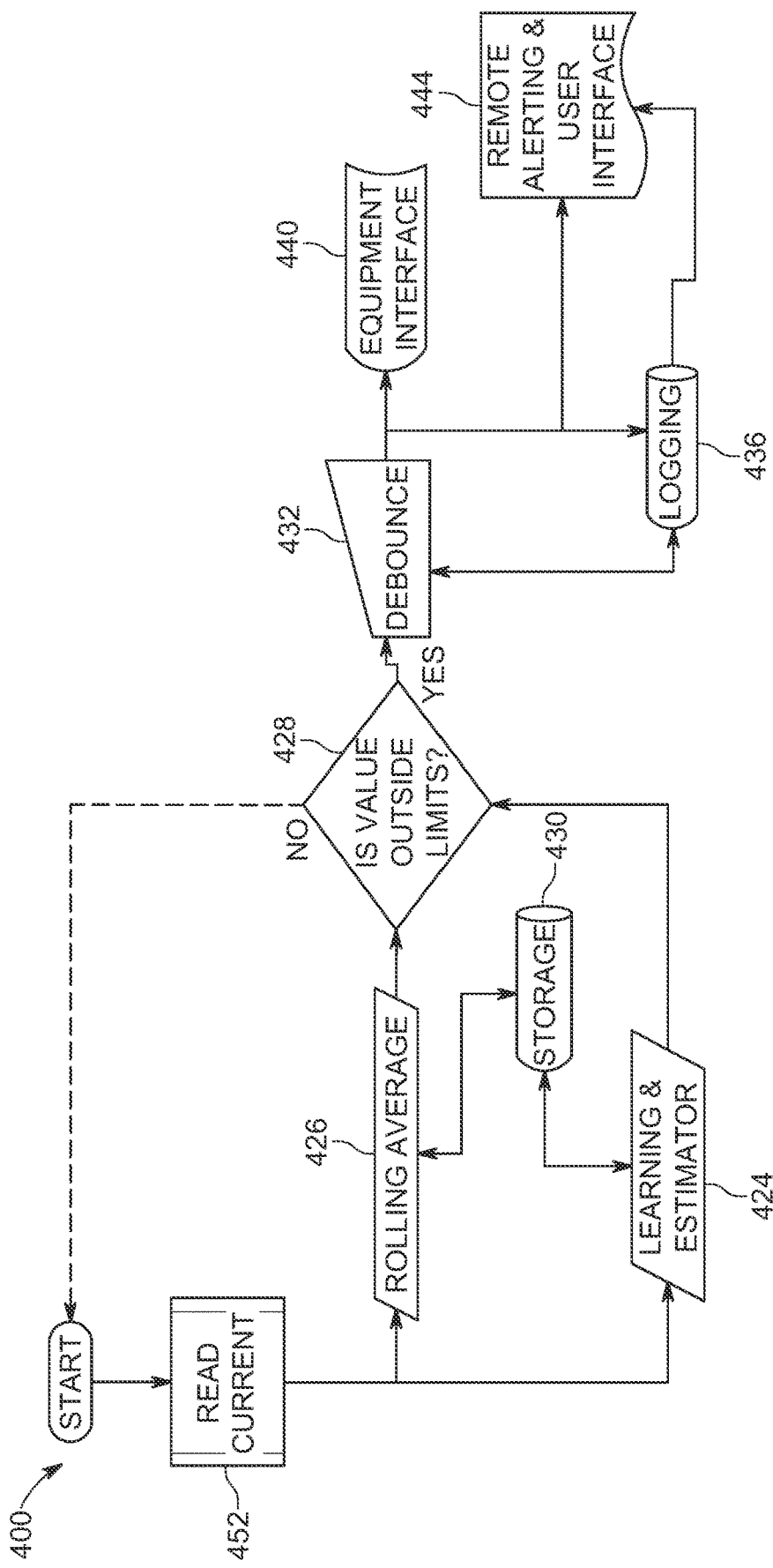
FIG. 8 is a flow chart illustrating an exemplary process for monitoring for and/or detecting paddle wear conditions using motor current according to an exemplary embodiment.

FIG. 8 is a flow chart illustrating an exemplary process 400 for monitoring for and/or detecting paddle wear conditions using motor current according to an exemplary embodiment. As shown in FIG. 8, the process 400 generally includes providing the motor current reading 452 as an input to a "learning & estimator" process 424 and to a rolling average process 426. The outputs from the "learning & estimator" process 424 and rolling average process 426 may be stored within storage 430 and used at the decision 428 whereat it is determined whether or not the value(s) are outside limit(s) or threshold(s).

The "learning & estimator" process 424 uses the motor current reading 452 to learn, estimate, and/or actively determine limit(s) or threshold(s) for the rolling average of the motor current. At the decision 428, it is determined whether or not the rolling average of the motor current is outside the limit(s) or threshold(s) determined by the "learning & estimator" process 424. If the rolling average of the motor current is determined to be outside the limit(s) or threshold(s) at the decision 428, then an alert is generated. If the rolling average of the motor current is determined to be within the limit(s) or threshold(s) at the decision 428, then no alert is generated.

Also shown in FIG. 8 are debounce and logging processes 432 and 436, an equipment interface 440, and a remote alerting and user interface 444. In this exemplary embodiment shown in FIG. 8, the limit(s) or threshold(s) regarding the motor current rolling average is learned, estimated, and/or actively determined by the "learning & estimator" process 424, such as shown in FIG. 6, etc. In other exemplary embodiments, the limit(s) or threshold(s) may be predetermined, equipment based, and/or fixed.

Exemplary embodiments include systems for monitoring for and/or detecting a freeze-up condition within a product dispenser and/or mixer including a motor and a paddle rotatable via the motor. In an exemplary embodiment, a system is configured to monitor for and/or detect: an increase in $4^{th}/1^{st}$ harmonic of an electrical current of the motor normalized for motor size; a characteristic frequency in a power factor of the motor; and a reduction in a coefficient of variation (COV) of the power factor outside of a threshold. The threshold may be learned, estimated, and/or actively determined by the system. Or, the threshold may be predetermined, equipment based, and/or fixed.

After the system detects the reduction in the coefficient of variation of the power factor that is outside of the threshold, the system may be configured to provide an alert that a freeze-up is imminent; and/or shut down the product dispenser and/or mixer; and/or reduce refrigeration of the product dispenser and/or mixer.

The system may be further configured to compare a rolling or moving average of electrical current peaks of the motor to a moving or rolling average of the electrical current of the motor; and to determine whether an electrical peak based value exceeds an electrical current based value by an amount. The system may be further configured to flag a paddle wear condition when the electrical peak based value exceeds the electrical current based value by the amount. For example, the system may be configured to determine whether the electrical peak based value exceeds the electrical current based value raised to the 1.4 power. The system may implemented with or provided for a soft frozen dessert dispenser and/or crushed ice drink dispenser.

An exemplary embodiment includes a method for monitoring for and/or detecting a freeze-up condition within a product dispenser and/or mixer including a motor and a paddle rotatable via the motor. The method includes: monitoring for an increase in $4^{th}/1^{st}$ harmonic of an electrical current of the motor as normalized for motor size; monitoring for a characteristic frequency in a power factor of the motor; and monitoring for a reduction in a coefficient of variation (COV) of the power factor outside of a threshold.

After detecting the reduction in the coefficient of variation of the power factor outside of the threshold, the method may further include providing an alert that a freeze-up is imminent; and/or shutting down the product dispenser and/or mixer; and/or reducing refrigeration of the product dispenser and/or mixer.

The method may further include comparing a rolling or moving average of electrical current peaks of the motor to a moving or rolling average of the electrical current of the motor; and determining whether an electrical peak based value exceeds an electrical current based value by an amount. The method may include flagging a paddle wear condition when the electrical peak based value exceeds the electrical current based value by the amount. For example, determining whether an electrical peak based value exceeds an electrical current based value by an amount may include determining whether the electrical peak based value exceeds the electrical current based value raised to the 1.4 power.

An exemplary embodiment includes a system for monitoring for and/or detecting paddle wear condition within a product dispenser and/or mixer including a motor and a paddle rotatable via the motor. The system is configured to: compare a rolling or moving average of electrical current peaks of the motor to a moving or rolling average of the electrical current of the motor; and determine whether an electrical peak based value exceeds an electrical current based value by an amount. The system may be configured to flag a paddle wear condition when the electrical peak based value exceeds the electrical current based value by the amount. For example, the system may be configured to determine whether the electrical peak based value exceeds the electrical current based value raised to the 1.4 power. The system may be implemented with or provided for a soft frozen dessert dispenser and/or crushed ice drink dispenser.

An exemplary embodiment includes a method for monitoring for and/or detecting paddle wear condition within a product dispenser and/or mixer including a motor and a paddle rotatable via the motor. The method includes comparing a rolling or moving average of electrical current peaks of the motor to a moving or rolling average of the electrical current of the motor; and determining whether an electrical peak based value exceeds an electrical current based value by an amount. The method may include flagging a paddle wear condition when the electrical peak based value exceeds the electrical current based value by the amount. For example, determining whether an electrical peak based value exceeds an electrical current based value by an amount may include determining whether the electrical peak based value exceeds the electrical current based value raised to the 1.4 power.

Exemplary embodiments disclosed herein may be implemented in various ways, e.g., as a separate board, a daughter board to another controller, integrated into a SureSwitch™ contactor from Emerson Electric Co., integrated into a present churn control board in which churn control is based on viscosity as indicated by churn motor current, etc. Alternatively, an exemplary embodiment may be configured such that data is sent to the cloud via the Internet, analyzed, and a response is communicated to the unit.

In exemplary embodiments, communication (e.g., alerts, etc.) may occur by various methods, including visual indicators, e-mail, SMS, SM post, notification on a central facilities management panel, etc. Accordingly, exemplary embodiments should not be limited to any single communication method.

In examples disclosed herein for monitoring for and/or detecting paddle wear and freeze-up conditions, rolling averages or learned values may be used instead of fixed thresholds. Using rolling averages or learned values instead of fixed thresholds allows exemplary embodiments disclosed herein to be used on a variety of devices. For example, the use of rolling averages or learned values may allow the same module firmware to be used on a variety of product dispensers and mixers, such as continuous run soft serve vending machines, dispensers associated with soft frozen desserts (e.g., soft serve ice cream, frozen yogurt, malts, milkshakes, other soft frozen edibles or products, etc.), dispensers associated with frozen, slushy, or crushed ice drinks (e.g., frozen coffee drinks, frozen margaritas, frozen daiquiris, other drinkables or potable products, etc.), etc.

In addition, there may be some overlap of the method for monitoring for and/or detecting paddle wear condition and method for monitoring for and/or detecting freeze-up condition when ran simultaneously, which may generally result in an earlier trigger of the freezing alert or flag. To accommodate this, alert levels may be assigned on frequency and duration of trigger conditions.

Exemplary embodiments disclosed herein may provide more reliable and/or accurate detection of wear and freeze-up. As recognized herein, conventional low mix sensors may be fooled, such as by a stiff mix in the hopper, plugged fill orifice, adding frozen/slushy mix, etc. And, conventional break away couplings and belt slippage tend to not be reliable.

Accordingly, disclosed herein are exemplary embodiments configured for using a moving average of the peak electrical current to a moving average of the average electrical current. Such exemplary embodiments may advantageously be used, for example, to detect and then prevent damage to a mixing paddle and/or to the gear box, belt, drive train driving the paddle.

Exemplary embodiments disclosed herein may be applied to or used with a variety of product dispensers and mixers, including continuous run soft serve vending machines, dispensers associated with soft frozen desserts (e.g., soft serve ice cream, frozen yogurt, malts, milkshakes, other soft frozen edibles or products, etc.), dispensers associated with frozen, slushy, or crushed ice drinks (e.g., frozen coffee drinks, frozen margaritas, frozen daiquiris, other drinkables or potable products, etc.), etc. Accordingly, exemplary embodiments disclosed herein should not be limited to use with only a single type of product dispenser, product mixer, or dispensable product.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (the disclosure of a first value and a second value for a given parameter can be interpreted as disclosing that any value between the first and second values could also be employed for the given parameter). Similarly, it is envisioned that disclosure of two or more ranges of values for a parameter (whether such ranges are nested, overlapping or distinct) subsume all possible combination of ranges for the value that might be claimed using endpoints of the disclosed ranges.

The terminology used herein is for the purpose of describing particular example embodiments only and is not intended to be limiting. For example, when permissive phrases, such as "may comprise", "may include", and the like, are used herein, at least one embodiment comprises or includes the feature(s). As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances. Whether or not modified by the term "about," the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A system for monitoring for and/or detecting a freeze-up condition within a product dispenser and/or mixer including a motor and a paddle rotatable via the motor, the system configured to monitor for and/or detect:
    an increase in $4^{st}/1^{st}$ harmonic of an electrical current of the motor normalized for motor size;
    a characteristic frequency in a power factor of the motor; and
    a reduction in a coefficient of variation of the power factor outside of a thresholds;
wherein the system is configured to:
    determine the increase in the $4^{th}/1^{st}$ harmonic of the electrical current of the motor by using a ratio of the 4th harmonic to fundamental of the electrical current of the motor as determined by root mean square and Fast Fourier Transform spectral analysis;
    determine the characteristic frequency in the power factor by a Fast Fourier Transform spectral analysis of the power factor to determine a predominate or primary frequency; and
    determine the reduction in the coefficient of variation of the power factor by monitoring for a reduction in variance of the power factor from nominal.

2. The system of claim 1, wherein after the system detects the reduction in the coefficient of variation of the power factor that is outside of the threshold, the system is configured to:
    provide an alert that a freeze-up is imminent; and/or
    shut down the product dispenser and/or mixer; and/or
    reduce refrigeration of the product dispenser and/or mixer.

3. The system of claim 1, wherein the system is configured to:
    determine a ratio of the $4^{th}$ harmonic to fundamental of the electrical current of the motor determined by using root mean square and Fast Fourier Transform spectral analysis;
    learn, estimate, and/or actively determine a limit for the $4^{th}$ harmonic to fundamental ratio;
    determine whether the $4^{th}$ harmonic to fundamental ratio is outside the limit; and
    provide an alert if the $4^{th}$ harmonic to fundamental ratio is determined to be outside the limit.

4. The system of claim 1, wherein the system is configured to:
    learn, estimate, and/or actively determine a limit for a mean power factor;
    determine whether the mean power factor is outside the limit; and
    provide an alert if the mean power factor is determined to be outside the limit.

5. The system of claim 1, wherein the system is configured to:
  determine a primary frequency by using a Fast Fourier Transform spectral analysis of the power factor;
  learn, estimate, and/or actively determine a limit for the primary frequency;
  determine whether the primary frequency is outside the limit; and
  provide an alert if the primary frequency is determined to be outside the limit.

6. The system of claim 1, wherein the system is configured to:
  learn, estimate, and/or actively determine a limit for the coefficient of variation of the power factor;
  determine whether the coefficient of variation of the power factor is outside the limit; and
  provide an alert if the coefficient of variation of the power factor is determined to be outside the limit.

7. The system of claim 1, wherein the threshold is learned, estimated, and/or actively determined by the system.

8. The system of claim 1, wherein the threshold is predetermined, equipment based, and/or fixed.

9. A soft frozen dessert dispenser and/or crushed ice drink dispenser including the system of 1.

10. Method for monitoring for and/or detecting a freeze-up condition within a product dispenser and/or mixer including a motor and a paddle rotatable via the motor, the method comprising:
  monitoring for an increase in $4^{th}/1^{st}$ harmonic of an electrical current of the motor as normalized for motor size;
  monitoring for a characteristic frequency in a power factor of the motor; and
  monitoring for a reduction in a coefficient of variation of the power factor outside of a threshold;
  wherein the method includes:
    determining the increase in the $4^{th}/1^{st}$ harmonic of the electrical current of the motor by using a ratio of the $4^{th}$ harmonic to fundamental ratio of the electrical current of the motor as determined by root mean square and Fast Fourier Transform spectral analysis; and/or
    determining the characteristic frequency in the power factor by a Fast Fourier Transform spectral analysis of the power factor to determine a predominate or primary frequency; and
    determining the reduction in the coefficient of variation of the power factor by monitoring for a reduction in variance of the power factor from nominal.

11. The method of claim 10, wherein after detecting the reduction in the coefficient of variation of the power factor outside of the threshold, the method further comprises:
  providing an alert that a freeze-up is imminent; and/or
  shutting down the product dispenser and/or mixer; and/or
  reducing refrigeration of the product dispenser and/or mixer.

12. A system for monitoring for and/or detecting paddle wear condition within a product dispenser and/or mixer including a motor and a paddle rotatable via the motor, the system configured to:
  compare a moving average of electrical current peaks of the motor to a moving average of the electrical current of the motor; and
  determine whether an electrical peak based value exceeds an electrical current based value by an amount
  wherein the system is configured to:
    determine an increase in $4^{th}/1^{st}$ harmonic of the electrical current of the motor normalized for motor size by using a ratio of the 4th harmonic to fundamental of the electrical current of the motor as determined by root mean square and Fast Fourier Transform spectral analysis;
    determine a characteristic frequency in a power factor by a Fast Fourier Transform spectral analysis of the power factor to determine a predominate or primary frequency; and
    determine a reduction in a coefficient of variation of the power factor by monitoring for a reduction in variance of the power factor from nominal.

13. The system of claim 12, wherein the system is configured to flag a paddle wear condition when the electrical peak based value exceeds the electrical current based value by the amount.

14. The system of claim 12, wherein the system is configured to:
  compare the moving average of the electrical current peaks of the motor to the moving average of the electrical current of the motor over time;
  determine whether the electrical peak based value exceeds the electrical current based value raised to the 1.4 power over the time; and
  flag a paddle wear condition when the electrical peak based value exceeds the electrical current based value raised to the 1.4 power.

15. A method for monitoring for and/or detecting paddle wear condition within a product dispenser and/or mixer including a motor and a paddle rotatable via the motor, the method comprising:
  comparing a moving average of electrical current peaks of the motor to a moving average of the electrical current of the motor; and
  determining whether an electrical peak based value exceeds an electrical current based value by an amounts;
  wherein the method includes:
    determining an increase in $4^{th}/1^{st}$ harmonic of the electrical current of the motor normalized for motor size by using a ratio of the $4^{th}$ harmonic to fundamental of the electrical current of the motor as determined by root mean square and Fast Fourier Transform spectral analysis;
    determining a characteristic frequency in a power factor by a Fast Fourier Transform spectral analysis of the power factor to determine a predominate or primary frequency; and
    determining a reduction in a coefficient of variation of the power factor by monitoring for a reduction in variance of the power factor from nominal.

16. The method of claim 15, further comprising flagging a paddle wear condition when the electrical peak based value exceeds the electrical current based value by the amount.

17. The method of claim 15, wherein the method includes:
  comparing the moving average of the electrical current peaks of the motor to the moving average of the electrical current of the motor over time;
  determining whether the electrical peak based value exceeds the electrical current based value raised to the 1.4 power over the time; and
  flagging a paddle wear condition when the electrical peak based value exceeds the electrical current based value raised to the 1.4 power.

* * * * *